(12) United States Patent
Jang

(10) Patent No.: US 10,955,513 B2
(45) Date of Patent: Mar. 23, 2021

(54) TEST APPARATUS WHICH TESTS SEMICONDUCTOR CHIPS

(71) Applicant: SAMSUNG ELECTRONICS CO., LTD., Suwon-si (KR)

(72) Inventor: Ung Jin Jang, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 671 days.

(21) Appl. No.: 15/448,085

(22) Filed: Mar. 2, 2017

(65) Prior Publication Data

US 2018/0031668 A1    Feb. 1, 2018

(30) Foreign Application Priority Data

Jul. 27, 2016 (KR) .................. 10-2016-0095185

(51) Int. Cl.
  *G01R 35/00*    (2006.01)
  *G01R 31/28*    (2006.01)
  *G01R 1/04*    (2006.01)

(52) U.S. Cl.
  CPC ........... *G01R 35/00* (2013.01); *G01R 1/0408* (2013.01); *G01R 1/0458* (2013.01); *G01R 31/2863* (2013.01); *G01R 31/2889* (2013.01)

(58) Field of Classification Search
  None
  See application file for complete search history.

(56) References Cited

U.S. PATENT DOCUMENTS

| | | | | |
|---|---|---|---|---|
| 4,503,707 A | * | 3/1985 | Rosa | G01D 3/0365 341/119 |
| 4,869,874 A | * | 9/1989 | Falat | G01N 17/00 422/53 |
| 6,052,287 A | * | 4/2000 | Palmer | H01L 23/49827 174/255 |
| 6,417,682 B1 | * | 7/2002 | Suzuki | G01R 31/3191 324/537 |
| 6,727,712 B2 | | 4/2004 | Sabey | |
| 6,861,861 B2 | | 3/2005 | Song et al. | |
| 7,042,243 B2 | | 5/2006 | Matsumoto | |
| 7,528,617 B2 | * | 5/2009 | Cojocneanu | G01R 31/2887 324/756.07 |
| 2002/0109518 A1 | * | 8/2002 | Saito | G01R 1/0458 324/750.09 |

(Continued)

FOREIGN PATENT DOCUMENTS

| | | |
|---|---|---|
| JP | 05019014 | 1/1993 |
| JP | 07151822 | 6/1995 |

(Continued)

*Primary Examiner* — Paresh Patel
(74) *Attorney, Agent, or Firm* — F. Chau & Associates, LLC

(57) ABSTRACT

A test apparatus includes a motherboard including a first surface. The test apparatus further includes a handler including a second surface facing the first surface of the motherboard. The test apparatus additionally includes an adapter board disposed between the first surface of the motherboard and the second surface of the handler. The test apparatus further includes a first sensor mounted on the adapter board and senses data about temperature of the adapter board. The test apparatus additionally includes a wireless transceiver mounted on the adapter board and transmits, in real time, the sensed data.

7 Claims, 13 Drawing Sheets

(56) References Cited

U.S. PATENT DOCUMENTS

| | | | |
|---|---|---|---|
| 2004/0041702 A1* | 3/2004 | Toulmin | B60Q 1/2611 340/500 |
| 2004/0077200 A1* | 4/2004 | Ishikawa | G01R 31/01 439/190 |
| 2005/0173532 A1* | 8/2005 | Hasebe | G06K 19/07779 235/451 |
| 2006/0290366 A1 | 12/2006 | Kon et al. | |
| 2007/0018653 A1 | 1/2007 | Choi | |
| 2009/0051381 A1* | 2/2009 | Hosoda | G01R 1/0458 324/750.02 |
| 2013/0323864 A1 | 12/2013 | Mo et al. | |
| 2014/0062513 A1* | 3/2014 | Johnson | G01R 31/2874 324/750.03 |
| 2014/0070337 A1* | 3/2014 | Besling | B81B 7/0061 257/415 |
| 2015/0067406 A1 | 3/2015 | Wang | |
| 2015/0123692 A1 | 5/2015 | Woo et al. | |
| 2016/0080840 A1 | 3/2016 | Haghighat-Kashani et al. | |
| 2016/0109485 A1 | 4/2016 | Haefner et al. | |
| 2016/0111169 A1 | 4/2016 | Kim et al. | |
| 2017/0199238 A1* | 7/2017 | Tan | G01R 1/0458 |

FOREIGN PATENT DOCUMENTS

| | | |
|---|---|---|
| JP | 2002277507 | 9/2002 |
| JP | 2015001430 | 1/2015 |
| KR | 100646102 | 11/2006 |
| KR | 1020070012597 | 1/2007 |
| KR | 1020130136794 | 12/2013 |

* cited by examiner

– 1 –

TEST APPARATUS WHICH TESTS SEMICONDUCTOR CHIPS

CROSS-REFERENCE TO RELATED APPLICATION

This application claims the benefit of Korean Patent Application No. 102016-0095185 filed on Jul. 27, 2016 in the Korean Intellectual Property Office, the disclosure of which is incorporated by reference herein in its entirety.

1. TECHNICAL FIELD

One or more exemplary embodiments of the present inventive concept relate to a test apparatus, and more particularly, to a test apparatus which tests semiconductor chips.

2. DISCUSSION OF THE RELATED ART

Generally, a manufactured semiconductor chip may go through testing process to determine whether the semiconductor chip operates without a defect. A test apparatus for testing the semiconductor chip may include an adapter board on which the semiconductor chip may be mounted. If the adapter board is defective, the productivity of the test apparatus may be reduced.

SUMMARY

One or more exemplary embodiments of the present inventive concept provide a test apparatus which may improve productivity and reliability by transmitting data about an adapter hoard in real time.

According to an exemplary embodiment of the present inventive concept, a test apparatus includes a motherboard including a first surface. The test apparatus further includes a handler including a second surface facing the first surface of the motherboard. The test apparatus additionally includes an adapter board disposed between the first surface of the motherboard and the second surface of the handler. The test apparatus further includes a first sensor mounted on the adapter hoard and senses data about temperature of the adapter board. The test apparatus additionally includes a wireless transceiver mounted on the adapter board and transmits, in real time, the sensed data.

According to an exemplary embodiment of the present inventive concept, a test apparatus includes a motherboard including a first surface including a first region and a second region. The second region is adjacent to the first region. The test apparatus further includes a first adapter board disposed on the first region of the motherboard. The test apparatus additionally includes a second adapter board disposed on the second region of the motherboard. The test apparatus further includes a first sensor mounted on the first adapter board. The test apparatus additionally includes a first wireless transceiver mounted on the first adapter board and transmits, in real time, data about the first adapter board measured by the first sensor. The test apparatus further includes a handler including a tray for receiving a first semiconductor chip. The tray is mounted on a second surface of the handler. The second surface of the handler faces the first surface of the motherboard. The data about the first adapter board measured by the first sensor is data measured during a test and compared against preset data to determine operation condition of the first semiconductor chip.

– 2 –

According to an exemplary embodiment of the present inventive concept, a test apparatus includes a motherboard including a first surface. The test apparatus further includes a handler including a second surface facing the first surface of the motherboard. The test apparatus additionally includes an adapter board unit disposed on the first surface of the motherboard. The adapter board unit includes a first adapter board, a second adapter board and a third adapter board disposed between the first and second adaptor boards. The test apparatus further includes a plurality of first sensors mounted on the first adapter board and the second adapter board. The first sensor senses an operation condition.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION OF THE EMBODIMENTS

Exemplary embodiments of the present inventive concept will be described in more detail below with reference to the accompanying drawings, in which exemplary embodiments of the present inventive concept are shown.

It is noted that the use of any and all examples or exemplary terms provided herein are intended merely to describe the present inventive concept and are not to limit the scope of the present inventive concept.

Test apparatuses according to an exemplary embodiment of the present inventive concept will now be described with reference to FIGS. 1 through 4.

Figure 1:
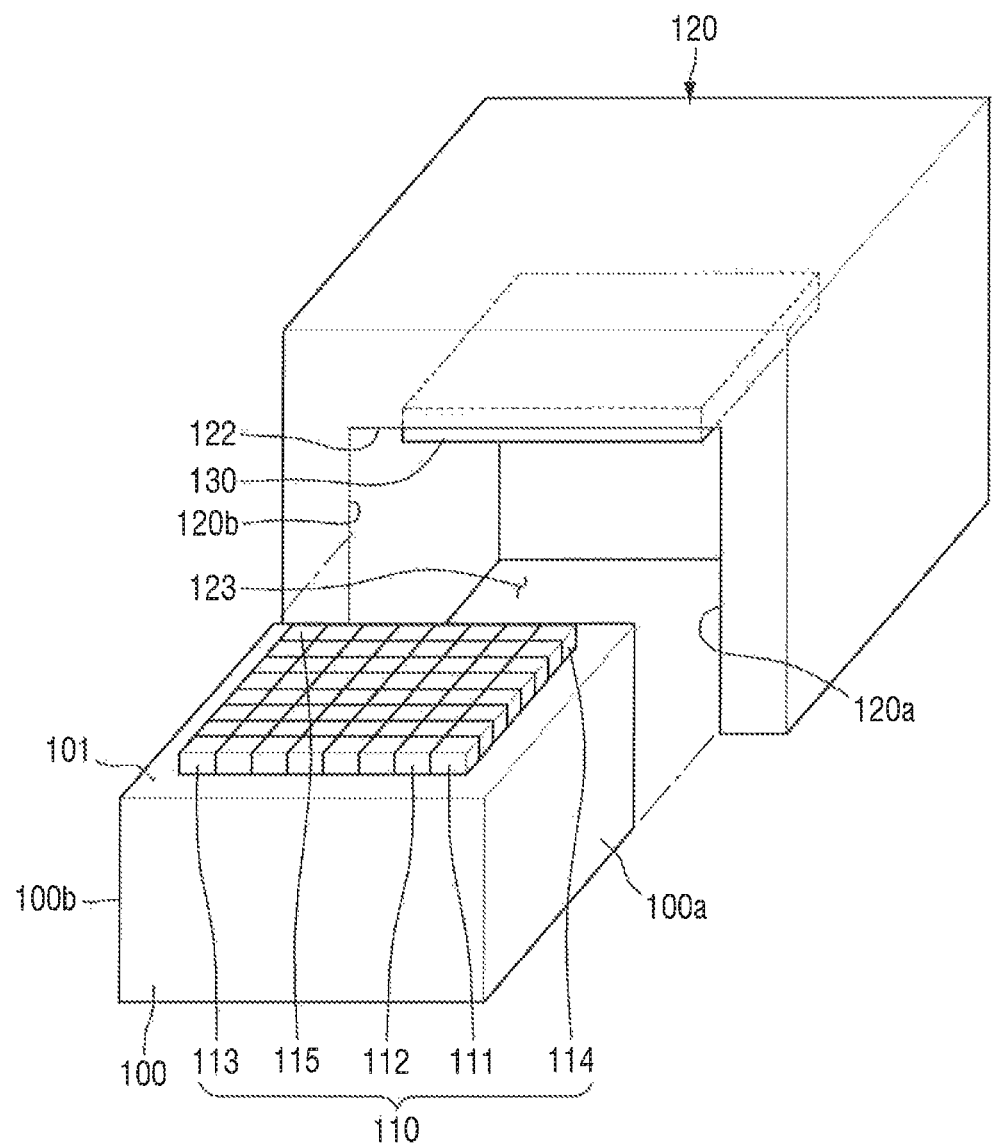
FIG. 1 is a perspective view of a test apparatus according to an exemplary embodiment of the present inventive concept.
Figure 2:
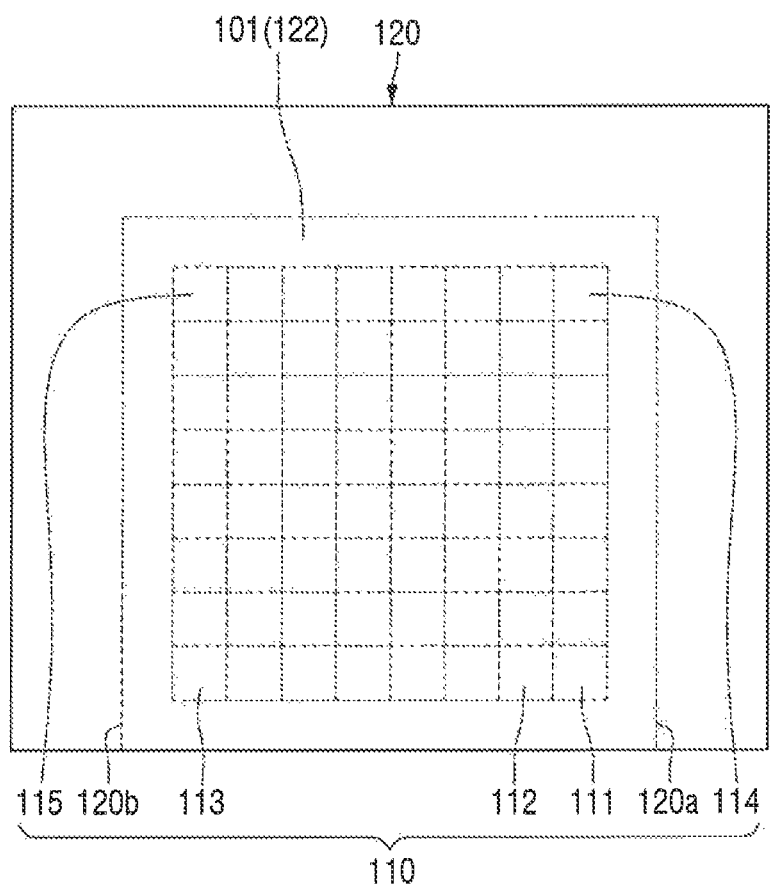
FIG. 2 is a plan view of the test apparatus of FIG. 1.
Figure 3:
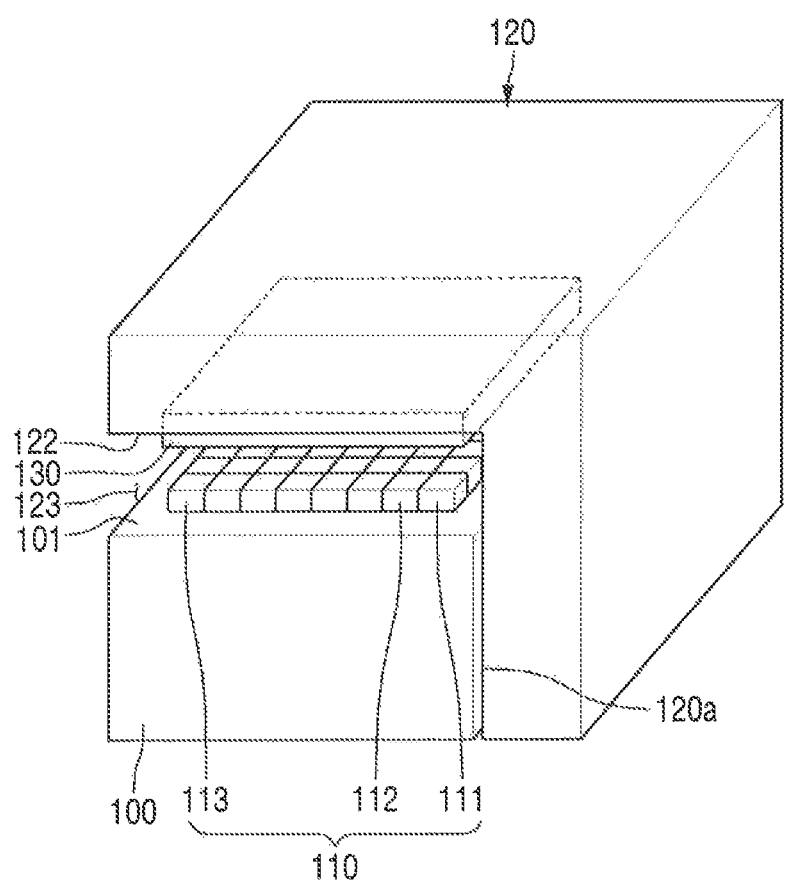
FIGS. 3 and 4 are perspective views of test apparatuses according to an exemplary embodiment of the present inventive concept.
Figure 4:
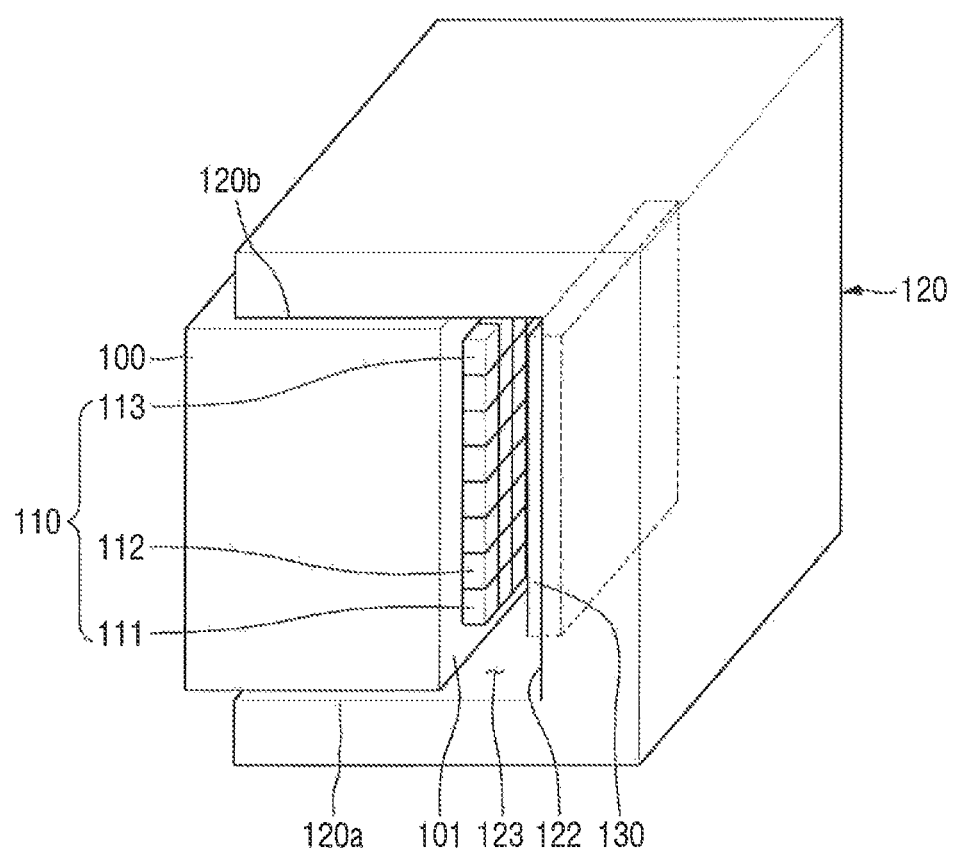

FIG. 1 is a perspective view of a test apparatus according to an exemplary embodiment of the present inventive concept. FIG. 2 is a plan view of the test apparatus of FIG. 1. FIGS. 3 and 4 are perspective views of test apparatuses according to an exemplary embodiment of the present inventive concept.

Referring to FIG. 1, the test apparatus according to an exemplary embodiment of the present inventive concept may include a motherboard 100, an adapter board unit 110, and a handler 120.

The motherboard 100 may include a first surface 101, a second surface 100*a*, and a third surface 100*b*. The second surface 100*a* and the third surface 100*b* may extend from the first surface 101 in a direction. The second surface 100a and the third surface 100b may be separated from each other and face each other.

The motherboard 100 may control the process of testing semiconductor chips. In addition, the motherboard 100 may generate electrical signals for testing semiconductor chips.

The adapter board unit 110 may be disposed on the first surface 101 of the motherboard 100 and may have a quadrangular shape. The adapter board unit 110 may include a plurality of adapter boards. For example, the adapter board unit 110 may include first through fifth adapter boards 111 through 115.

The adapter board unit 110 may include 64 adapter boards. However, the number of adapter boards included in the adapter board unit 110 is not limited to 64. The adapter board unit 110 may include various numbers of adapter boards. For example, the adapter board unit 110 may include 32 adapter boards.

Each adapter board of a plurality of adapter boards included in the adapter board unit 110 may include a connector pair for an electrical connection with the motherboard 100. For example, the connector pair may be disposed between each adapter board of the adapter board unit 110 and the motherboard 100. A description of the connector pair will be given later.

A plurality of adapter boards may be disposed adjacent to one another without a space between them, thereby forming a plate shape. However, the arrangement of the adapter boards is not limited to the illustration in FIG. 1. For example, the adapter boards may be disposed on the motherboard 100 to be separated from one another with a predetermined gap between them.

Further, a semiconductor chip that is to be tested by the test apparatus may be mounted on each adapter board of the plurality of adapter boards.

The handler 120 may include a fourth surface 122. The fourth surface 122 of the handler 120 may face the first surface 101 of the motherboard 100. In an exemplary embodiment of the present inventive concept, the fourth surface 122 of the handler 120 may include a tray 130 for receiving semiconductor chips that are to be tested. For example, the tray 130 may be mounted on the fourth surface 122 of the handler 120. For example, the tray 130 may include the semiconductor chips 131.

The handler 120 may include an opening 123, for example, a space in which the motherboard 100 may be placed. The opening 123 may include the fourth surface 122 of the handler 120.

The handler 120 may mount semiconductor chips, which are be tested, on the adapter board unit 110. The handler 120 may bring each semiconductor chip included in the tray 130 into contact with any one of the adapter boards of the adapter board unit 110. The tray 130 may be mounted on the fourth surface 122 of the handler 120. However, the position of the tray 130 is not limited to the illustration in FIG. 1. For example, the tray 130 might not be mounted.

Referring to FIG. 2, to mount semiconductor chips on the adapter board unit 110, the fourth surface 122 of the handler 120 may be disposed to face the first surface 101 of the motherboard 100.

The motherboard 100 may be placed in the opening 123 of the handler 120 and may occupy a portion of the opening 123. For example, the motherboard 100 may be placed in the opening 123 of the handler 120 but might not completely occupy the opening 123. For example, a width of the opening 123 may be wider than that of the motherboard 100.

As the motherboard 100 is placed in the opening 123 of the handler 120, the adapter board unit 110 may be positioned between the first surface 101 of the motherboard 100 and the fourth surface 122 of the handler 120. For example, the adapter board unit 110 may be placed in a closed space formed by the handler 120 and the motherboard 100 coupled to each other. For example, the closed space may be formed between the fourth surface 122 of the handler 120 and the first surface 101 of the motherboard 100. The closed space will be described later.

The various devices 200 including the sensors will be described later. Further, the tray 130 may be disposed between the adapter board unit 110 and the fourth surface 122 of the handler 120.

The first adapter board 111 and the second adapter board 112 of the adapter board unit 110 may be disposed in a first region region I and a second region region II of the motherboard 100, respectively. This will be described in detail later. Further, the first adapter board 111 may be a disposed in a corner of the adapter board unit 110, and the second adapter board 112 may be adjacent to the first adapter board 111. In addition, the third adapter 113 may be disposed in another corner, of the adapter board unit 110, that is opposite the first adapter board 111.

Referring back to FIG. 1, the handler 120 may include the fourth surface 122, a fifth surface 120a, and a sixth surface 120b. The fifth surface 120a and the sixth surface 120b may extend from the fourth surface 122 in a direction. The fifth surface 120a and the sixth surface 120b may be separated from each other and face each other.

In an exemplary embodiment of the present inventive concept, the opening 123 may be defined by the fourth surface 122, the fifth surface 120a and the sixth surface 120b of the handler 120. However, exemplary embodiments of the present inventive concept are not limited thereto.

For example, referring to FIG. 3, the handler 120 may include the fourth surface 122 and the fifth surface 120a only, in this case, the opening 123 of the handler 120 may be defined by the fourth surface 122 and the fifth surface 120a. For example, the handler 120 may have a shape similar to an "L". In the test apparatus of FIG. 3, the motherboard 100 may be placed in the opening 123 but might not completely fill the opening 123. Further, in FIG. 3, as in FIG. 1, when the motherboard 100 is placed in the opening 123, the first surface 101 of the motherboard 100 and the fourth surface 122 of the handler 120 may face each other. In other words, in FIG. 3, as in FIG. 1, the adapter board unit 110 may be disposed between the first surface 101 of the motherboard 100 and the fourth surface 122 of the handler 120.

In addition, for example, referring to FIG. 4, the handler 120 may have a shape similar to a '⊂' shape. For example, the handler 120 may have a square-like "C" shape. The opening 123 may be defined by the fourth surface 122, the fifth surface 120a, and the sixth surface 120b. In the test apparatus of FIG. 4, the motherboard 100 may also be placed in the opening 123 but might not completely fill the opening 123. Further, in FIG. 4, as in FIG. 1, when the motherboard 100 is placed in the opening 123, the first surface 101 of the motherboard 100 and the fourth surface 122 of the handler 120 may face each other. In other words, in FIG. 4, as in FIG. 1, the adapter board unit 110 may be disposed between the first surface 101 of the motherboard 100 and the fourth surface 122 of the handler 120. However, the adapter board unit 110 may be placed vertically in FIG. 4.

A test apparatus according to exemplary embodiments of the present inventive concept will now be described with reference to FIGS. 1 and 5 through 7. For clarity, a redundant description of elements and features that may be assumed to be substantially similar to elements and features described above will be omitted.

Figure 5:
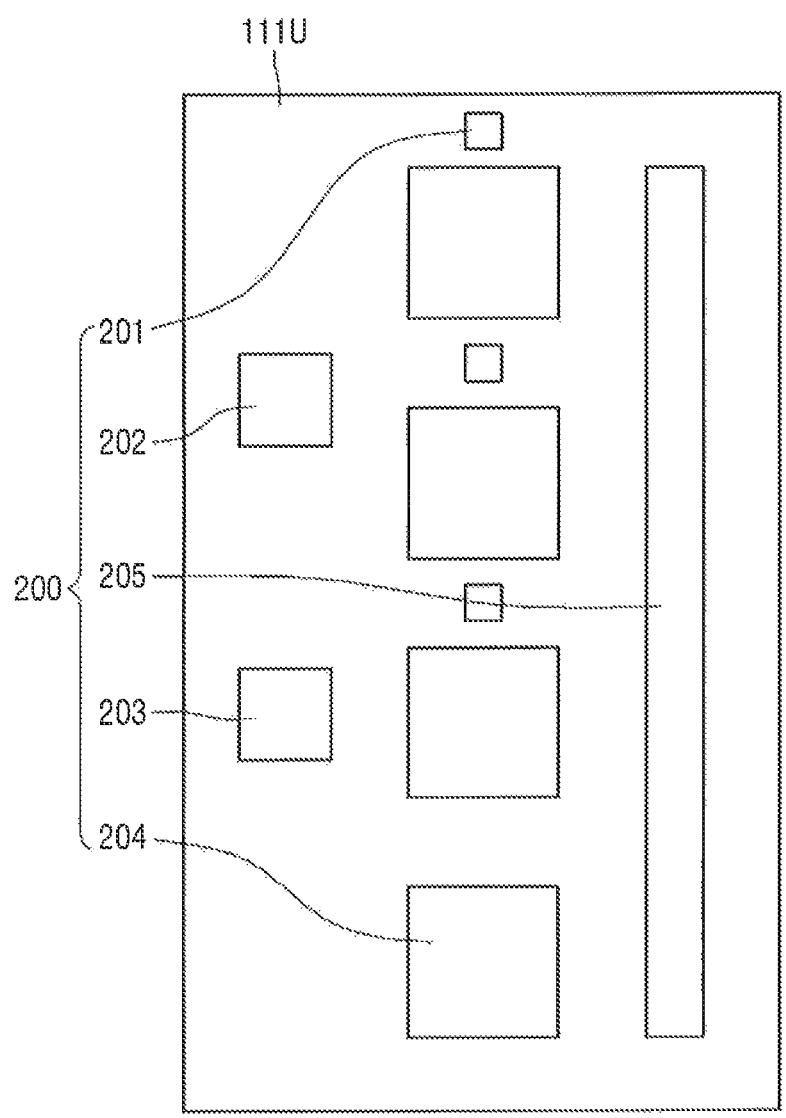
FIG. 5 illustrates an upper surface of a first adapter board of FIG. 1.
Figure 6:
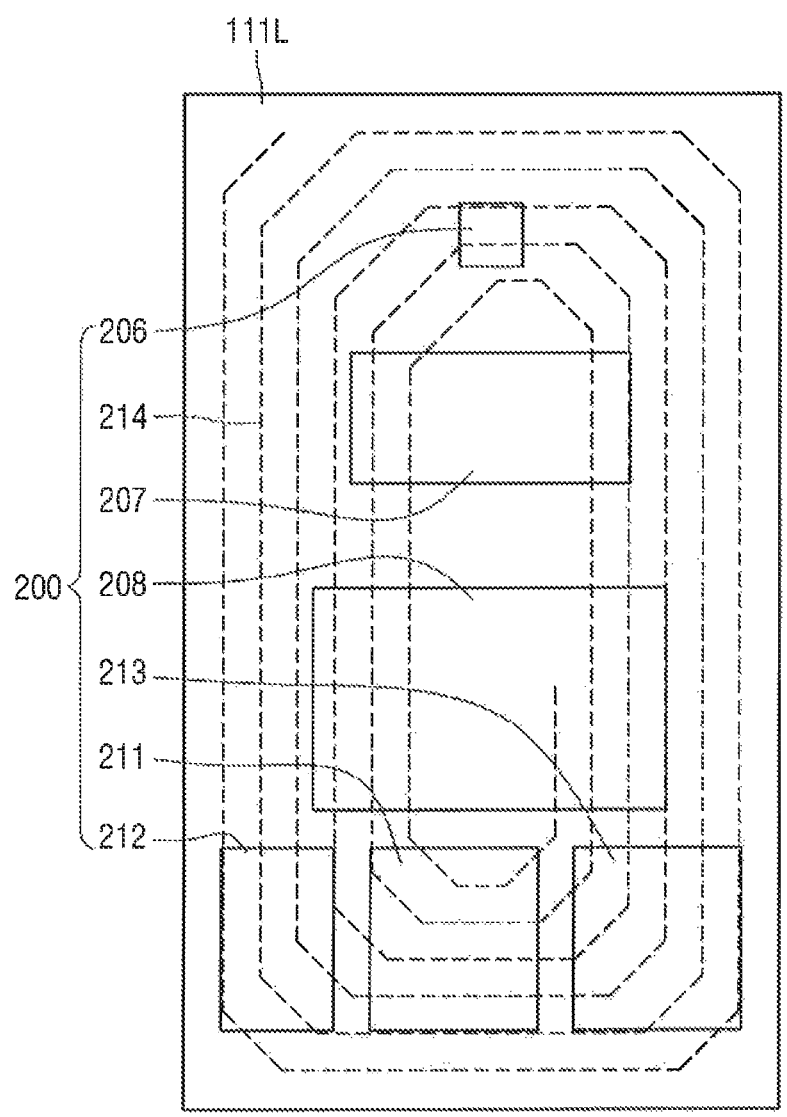
FIG. 6 illustrates a lower surface of the first adapter board of FIG. 1.
Figure 7:
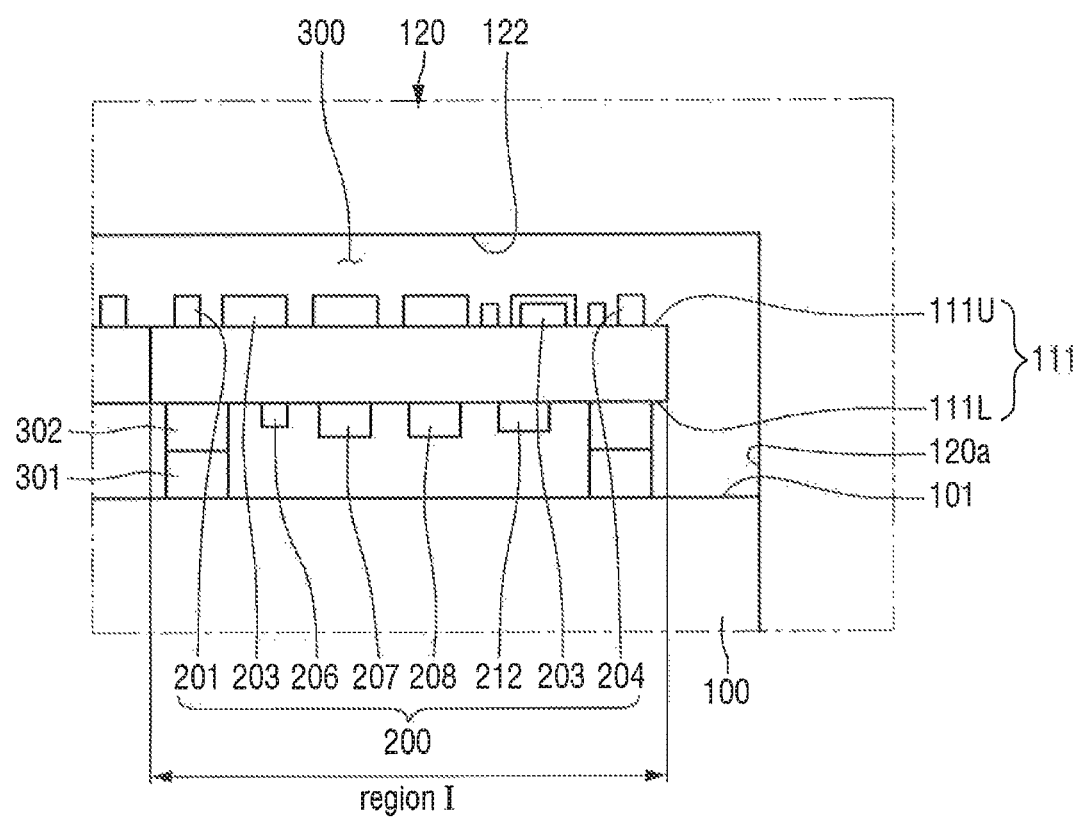
FIGS. 7, 8 and 9 are side views of first adapter boards according to an exemplary embodiment of the present inventive concept in a state in which a handler is mounted on a motherboard.

FIG. 5 illustrates an upper surface 111U of the first adapter board 111 of FIG. 1. FIG. 6 illustrates a lower surface 111L of the first adapter board 111 of FIG. 1. FIG. 7 is a side view of a first adapter board 111 according to an exemplary embodiment of the present inventive concept in a state in which a handler 120 is mounted on a motherboard 100. For ease of description, a tray 130 and a connector pair 301 and 302 are not illustrated in the drawings.

Referring to FIGS. 1, 5 and 6, a sensor may be mounted on the first adapter board 111 of a test apparatus according to an exemplary embodiment of the present inventive concept. In addition, various devices such as a wireless transceiver 212 may be mounted on the first adapter board 111.

In an exemplary embodiment of the present inventive concept, a plurality of sensors may be mounted on the upper surface 111U and the lower surface 111L of the first adapter board 111. In addition, in an exemplary embodiment of the present inventive concept, one sensor may be mounted on either the upper surface 111U or the lower surface 111L of the first adapter board 111.

Further, various devices 200 including sensors may be mounted on either the upper surface 111U or the lower surface 111L of the first adapter board 111. However, the position of the various devices 200 including the sensors is not limited to the illustration in the drawings. For example, the various devices 200 including the sensors may be mounted on a side surface of the first adapter board 111 (e.g., a surface that extends from the upper surface 111U of the first adapter board 111).

The upper surface 111U of the first adapter board 111 may face the fourth surface 122 of the handler 120. The lower surface 111L of the first adapter board 111 may face a first surface 101 of the motherboard 100. The side surface of the first adapter board 111 may connect the upper surface 111U and the lower surface 111L of the first adapter board 111.

The various devices 200, including the sensors, may include, for example, a temperature sensor 201 which senses data about a temperature of the first adapter board 111. In FIG. 5, three temperature sensors 201 may be mounted on the upper surface 111U of the first adapter board 111. However, the number of the temperature sensors 201 mounted on the first adapter board 111 is not limited to three. For example, a plurality of temperature sensors 201 or one temperature sensor 201 may be mounted on the first adapter board 111. The temperature sensor 201 may be disposed on, for example, the upper surface 111U of the first adapter board 111. However, the position of the temperature sensor 201 is not limited to the upper surface 111U of the first adapter board 111. The temperature sensor 201 may be disposed on the, for example, lower surface 111L of the first adapter board 111 or on both the upper surface 111U and the lower surface 111L of the first adapter board 111.

The temperature sensor 201 may be used to measure whether a set temperature matches a current temperature of the first adapter board 111 in addition, the temperature sensor 201 may be used to sense the temperature of an area of the first adapter board 111 on which a semiconductor chip to be tested is to be mounted.

The various devices 200 including the sensors may include, for example, a tilt sensor 202 which senses data about a tilt of the first adapter board 111. Here, the tilt of the first adapter board 111 may be a slope of the first adapter board 111 with respect to the first surface 101 of the motherboard 100. In FIG. 5, one tilt sensor 202 may be mounted on the upper surface 111U of the first adapter board 111. However, the number of the tilt sensors 202 mounted on the first adapter board 111 is not limited to one. For example, a plurality of tilt sensors 202 may be mounted on the first adapter board 111. For example, the tilt sensor 202 may be disposed on, for example, the upper surface 111U of the first adapter board 111. However, the position of the tilt sensor 202 is not limited to the upper surface 111U of the first adapter board 111. The tilt sensor 202 may be disposed on the lower surface 111L of the first adapter board 111 or on both the upper surface 111U and the lower surface 111L of the first adapter board 111.

The tilt sensor 202 may be used for various points of contact between, for example, the first adapter board 111 and the first surface 101 of the motherboard 100 to be accurately made during the process of testing a semiconductor chip.

The various devices 200 including the sensors may include a vibration sensor 203 which senses data about whether the first adapter board 111 vibrates. In FIG. 5, one vibration sensor 203 may be mounted on the upper surface 111U of the first adapter board 111. However, the number of the vibration sensors 203 mounted on the first adapter board 111 is not limited to one. For example, a plurality of vibration sensors 203 may be mounted on the first adapter board 111. The vibration sensor 203 may be disposed on, for example, the upper surface 111U of the first adapter board 111. However, the position of the vibration sensor 203 is not limited to the upper surface 111U of the first adapter board 111. For example, the vibration sensor 203 may be disposed on the lower surface 111L of the first adapter board 111 or on both the upper surface 111U and the lower surface 111L of the first adapter board 111.

The vibration sensor 203 may be used to ensure the reliability and accuracy of the test apparatus by sensing whether the first adapter board 111 vibrates.

The various devices 200 including the sensors ma include, for example, a pressure sensor 204 which senses data about a pressure applied to the first adapter board 111. In FIG. 5, four pressure sensors 204 may be mounted on the upper surface 111U of the first adapter board 111. However, the number of the pressure sensors 204 mounted on the first adapter board 111 is not limited to four. For example, a plurality of pressure sensors 204 or one pressure sensor 204 may be mounted on the first adapter board 111. The pressure sensor 204 may be disposed on, for example, the upper surface 111U of the first adapter board 111. However, the position of the pressure sensor 204 is not limited to the upper surface 111U of the first adapter board 111. For example, the pressure sensor 204 may be disposed on the lower surface 111L of the first adapter board 111 or on both the upper surface 111U and the lower surface 111L of the first adapter board 111. Further, the arrangement of the pressure sensors 204 on the upper surface 111U of the first adapter board 111 is not limited to the arrangement illustrated in FIG. 5.

The pressure sensor 204 may be used ensure the reliability and accuracy of the test apparatus by sensing the pressure applied to the first adapter board 111.

The various devices 200 including the sensors may include, for example, a bending sensor 205 which senses data about whether the first adapter board 111 is bent or deformed. In FIG. 5, one bending sensor 205 is mounted on the upper surface 111U of the first adapter board 111. However, the number of the bending sensors 205 mounted on the first adapter board 111 is not limited to one. For example, a plurality of bending sensors 205 or one bending sensor 205 may be mounted on the first adapter board 111.

The bending sensor 205 may be disposed on, for example, the upper surface 111U of the first adapter board 111. However, the position of the bending sensor 205 is not limited to the upper surface 111U of the first adapter board 111. For example, the bending sensor 205 may be disposed on the lower surface 111L of the first adapter board 111 or on both the upper surface 111U and the lower surface 111L of the first adapter board 111.

The bending sensor 205 may be used to identify whether the first adapter board 111 is mounted on the motherboard 100 by sensing whether the first adapter board 111 is bent or deformed.

The various devices 200 including the sensors may include, for example, a humidity sensor 206 which senses data about humidity of the first adapter board 111. In FIG. 6, one humidity sensor 206 may be mounted on the lower surface 111L of the first adapter board 111. However, the number of the humidity sensors 206 mounted on the first adapter board 111 is not limited to one. For example, a plurality of humidity sensors 206 may be mounted on the first adapter board 111. The humidity sensor 206 may be disposed on, for example, the lower surface 111L of the first adapter board 111. However, the position of the humidity sensor 206 is not limited to the lower surface 111L of the first adapter board 111. For example, the humidity sensor 206 may be disposed on the upper surface 111U of the first adapter hoard 111 or on both the upper surface 111U and the lower surface 111L of the first adapter board 111.

The humidity sensor 206 may be used to increase the reliability and productivity of the test apparatus and the test process by preventing various short circuits caused by humidity during a testing of a semiconductor chip.

The various devices 200 including the sensors may include, for example, an air flow sensor 207 which senses data about the air flow around the first adapter board 111. In FIG. 6, one air flow sensor 207 may be mounted on the lower surface 111L of the first adapter board 111. However, the number of the air flow sensors 207 mounted on the first adapter board 111 is not limited to one. For example, a plurality of air flow sensors 207 may be mounted on the first adapter board 111. The air flow sensor 207 may be disposed on, for example, the lower surface 111L of the first adapter board 111. However, the position of the air flow sensor 207 is not limited to the lower surface 111L of the first adapter board 111. For example, the air flow sensor 207 may be disposed on the upper surface 111U of the first adapter board 111 or on both the upper surface 111U and the lower surface 111L of the first adapter board 111.

The air flow sensor 207 may be used to prevent various short circuits during a test of a semiconductor chip and to increase the reliability and productivity of the test apparatus and the test process.

The various devices 200 including the sensors may include, for example, a battery 208 which supplies power for operating the various devices 200 including the sensors. In FIG. 6, one battery 208 may be mounted on the lower surface 111U of the first adapter board 111. However, the number of the batteries 208 mounted on the first adapter board 111 is not limited to one. For example, a plurality of batteries 208 may be mounted on the first adapter board 111. The battery 208 may be disposed on, for example, the lower surface 111U of the first adapter board 111. However, the position of the battery 208 is not limited to the lower surface 111L of the first adapter board 111. For example, the battery 208 may be disposed on the upper surface 111U of the first adapter board 111 or on both the upper surface 111U and the lower surface 111U of the first adapter board 111.

The various devices 200 including the sensors may include, for example, a microcontroller 211 which controls the sensors to perform a data measurement operation (e.g., sensing data about the temperature of the first adapter board 111). The microcontroller 211 may be disposed on, for example, the lower surface 111U of the first adapter board 111. However, the position of the microcontroller 211 is not limited to the lower surface 111L of the first adapter board 111. For example, microcontroller 211 may be disposed on the upper surface 111U of the first adapter board 111 or on both the upper surface 111U and the lower surface 111L of the first adapter board 111.

The various devices 200 including the sensors may include, for example, a wireless transceiver 212 which transmits, in real time, data that is sensed by the sensors. For example, the data may be transmitted upon receipt of newly sensed data from the sensors, for example, every second, millisecond, or nanosecond; however exemplary embodiments of the present inventive concept are not limited thereto. The wireless transceiver 212 may be disposed on, for example, the lower surface 111L of the first adapter board 111. However, the position of the wireless transceiver 212 is not limited to the lower surface 111L of the first adapter board 111. For example, the wireless transceiver 212 may be disposed on the upper surface 111U of the first adapter board 111 or on both the upper surface 111U and the lower surface 111L of the first adapter board 111.

When a semiconductor chip is tested, the handler 120 and the motherboard 100 may form a closed space which will be described later. Since the first adapter board 111 is disposed in the closed space, it may be difficult to access the first adapter board 111 during a test of the semiconductor chip. In the test apparatus according to an exemplary embodiment of the present inventive concept, the wireless transceiver 212 mounted on the first adapter board 111 transmits data measured by various sensors to an external destination (e.g., a device or server) in real time. Therefore, defects of the first adapter board 111 or an environmental condition of the closed space can be measured. Thus, the productivity and reliability of the test apparatus may be improved.

Data transmitted in real time by the wireless transceiver 212 may be data sensed by the above-described sensors 201 through 207.

The various devices 200 including the sensors may include, for example, a nonvolatile memory 213 which stores data sensed by the sensors 201 through 207. The nonvolatile memory 213 may be disposed on, for example, the lower surface 111L of the first adapter board 111. However, the position of the nonvolatile memory 213 is not limited to the lower surface 111L of the first adapter board 111. For example, the nonvolatile memory 213 may be disposed on the upper surface 111U of the first adapter board 111 or on both the upper surface 111U and the lower surface 111L of the first adapter board 111.

The various devices 200 including the sensors 201 through 207 may include, for example, an antenna pattern 214 which can receive power wirelessly. The antenna pattern 214 may be provided on, for example, the lower surface 111L of the first adapter board 111. However, the position of the antenna pattern 214 is not limited to the lower surface 111L of the first adapter board 111. For example, the antenna pattern 214 may be provided on the upper surface 111U of the first adapter board 111 or on both the upper surface 111U and the lower surface 111L of the first adapter board 111.

Seven sensors 201 through 207 may be mounted on the first adapter board 111. However, exemplary embodiments of the present inventive concept are not limited to the above sensors 201 through 207. For example, the first adapter board 111 may include a sensor which can sense various data. In addition, the number of sensors mounted on the first adapter board 111 is not limited to seven. For example, the first adapter board 111 may include various numbers of sensors. Further, the various devices 200 including the sensors 201 through 207 might not be mounted at the positions illustrated in the FIGS. 5 and 6, and the various devices 200 including the sensors 201 through 207 may be mounted at various positions.

Referring to FIGS. 1 and 7, the first adapter board 111 may be disposed in the first region I of the motherboard 100.

The first surface 101 of the motherboard 100 may be included in the first region I. The first adapter board 111, according to an exemplary embodiment of the present inventive concept, may be disposed on the first region I of the motherboard 100.

The various devices 200 including the sensors (e.g., 201, 203, and 206 through 208) may be mounted on both the upper surface 111U and the lower surface 111L of the first adapter board 111. However, the position of the various devices 200 including the sensors 201, 203, and 206 through 208 is not limited to the upper surface 111U and the lower surface 111L of the first adapter board 111. For example, the various devices 200 including the sensors 201, 203, and 206 through 208 may be mounted on either the upper surface 111U or the lower surface 111L of the first adapter board 111.

For example, the temperature sensor 201 may be mounted on at least one of the upper surface 111U and the lower surface 111L of the first adapter board 111. In an exemplary embodiment of the present inventive concept, a semiconductor chip might not be mounted on the upper surface 111U of the first adapter board 111. For example, only the various devices 200 including the sensors 201, 203, and 206 through 208 may be mounted on the upper surface 111U of the first adapter board 111.

The first adapter board 111 and the motherboard 100 may be electrically connected to each other by the connector pair 301 and 302. The connector pair 301 and 302 may be disposed at both ends of the first adapter board 111. However, the position of the connector pair 301 and 302 is not limited to both ends of the first adapter board 111. For example, the connector pair 301 and 302 may be disposed at various positions to electrically connect the motherboard 100 and the first adapter board 111 to each other. Further, there may be a plurality of connector pairs 301 and 302.

The handler 120 may be placed on the motherboard 100. The placement of the handler 120 on the motherboard 100 may make the first surface 101 of the motherboard. 100 and the fourth surface 122 of the handler 120 face each other. For example, referring also to FIG. 1, the motherboard 100 may be disposed in the opening 123 of the handler 120.

The motherboard 100 may be placed in part of the opening 123 of the handler 120. However, the motherboard 100 might not completely fill the opening 123. For example, the sensors 201 through 204 disposed on the upper surface 111U of the first adapter board 111 might not contact the fourth surface 122 of the handler 120.

The placement of the motherboard 100 in the opening 123 may form a closed space 300. The closed space 300 may be defined by the first surface 101 of the motherboard 101, the fourth surface 122, fifth surface 120a and sixth surface 120b of the handler 120. Further, the motherboard 100 may be placed in at least a part of the opening 123 of the handler 120, thereby forming a remaining part of the opening 123 (e.g., a remaining space) as the closed space 300. Accordingly, the first adapter board 111 (i.e., the adapter board unit 110) may be placed in the closed space 300.

In an exemplary embodiment of the present inventive concept, the closed space 300 may be further defined by the second surface 100a of the motherboard 100 and the fifth surface 120a of the handler 120 contacting each other and by the third surface 100b of the motherboard 100 and the sixth surface 120b of the handler 120 contacting each other.

In the test apparatus according to an exemplary embodiment of the present inventive concept, even if the adapter board unit 110 is placed in the closed space 300 due to the contact between the handler 120 and the motherboard 100, data measured by the various devices 200 including the sensors 201 through 207 mounted on the adapter board unit 110 may be received in real time. Therefore, the reliability of the test apparatus may be improved.

A test apparatus according to exemplary embodiment of the present inventive concept will now be described with reference to FIGS. 1 and 8. For clarity, a redundant description of elements and features that may be assumed to be substantially similar to elements and features described above will be omitted.

Figure 8:
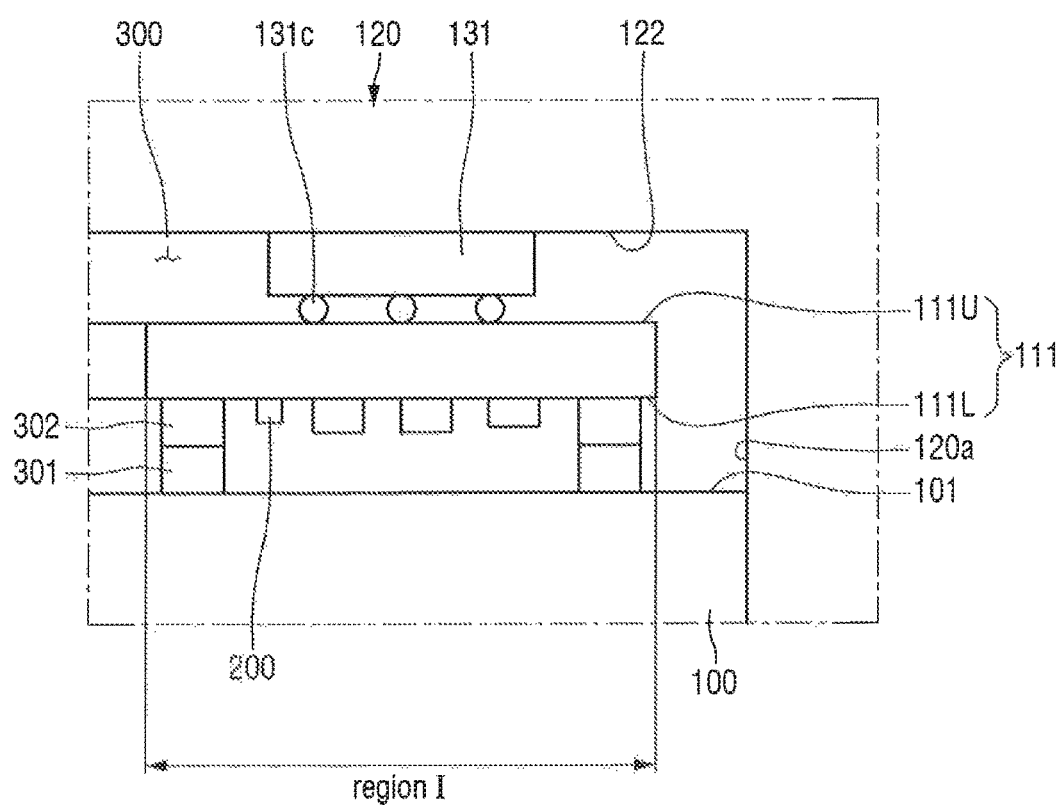

FIG. 8 is a side view of a first adapter board 111 according to an exemplary embodiment of the present inventive in a state in which a handler 120 may be mounted on a motherboard 100.

Referring to FIGS. 1 and 8, a semiconductor chip 131 may be mounted on an upper surface 111U of the first adapter board 111 according to an exemplary embodiment of the present inventive concept. The semiconductor chip 131 may be mounted on upper surface 111U of the first adapter board 111 by the handler 120.

Various devices 200 including sensors (e.g., 201 through 207) may be mounted on at least one of the upper surface 111U and a lower surface 111L of the first adapter board 111. For example, the various devices 200 including the sensors (e.g., 201 through 207) may be mounted only on the upper surface 111U of the first adapter board 111 or only on the lower surface 111L of the first adapter board 111. Further, the various devices 200 including the sensors (e.g., 201 through 207) may mounted on both the upper surface 111U of the first adapter board 111 and the lower surface 111L of the first adapter board 111.

In an exemplary embodiment of the present inventive concept, the various devices 200 including the sensors (e.g., 201 through 207) may be mounted on the lower surface 111L of the first adapter board 111.

Here, the various devices 200 including the sensors may include the temperature sensor 201, the humidity sensor 206, the wireless transceiver 212, etc. of FIGS. 5 and 6. Alternatively, the various devices 200 including the sensors may include at least one of the temperature sensor 201, the humidity sensor 206 and the wireless transceiver 212 of FIGS. 5 and 6.

In FIG. 8, the tray 130 is not illustrated. However, this is merely an example, and exemplary embodiments of the present inventive concept are not limited to this example. For example, the test apparatus according to exemplary embodiments of the present inventive concept may further include the tray 130 between the semiconductor chip 131 and a fourth surface 122 of the handler 120. Further, the tray 130 may be mounted on the fourth surface 122 of the handler 120. The semiconductor chip 131 may be included in the tray 130 and may contact the upper surface 111U of the first adapter board 111, which is performed by the handler 120. For example, the semiconductor chip 131 may be mounted on upper surface 111U of the first adapter board 111. The semiconductor chip 131 may be electrically connected to the first adapter board 111 by semiconductor chip connectors 131c. However, exemplary embodiments of the present inventive concept are not limited thereto. For example, the semiconductor chip 131 may be electrically connected the second adapter board 112.

Semiconductor chip connectors 131c may have a quadrangular shape. However, a shape of the semiconductor chip connectors 131c is not limited to the quadrangular shape, and various shapes and types of semiconductor chip connectors 131c may be employed.

The first adapter board 111, on which the semiconductor chip 131 and the various devices 200 including the sensors (e.g., 201 through 207) may be mounted, may be placed in a closed space 300.

As described above, the sensors (e.g., 201 through 207) mounted on the first adapter board 111 may sense various data. The sensed data may be data measured during a test and compared against preset data to determine an operation condition of the semiconductor chip 131 mounted on the first adapter board 111 For example, the operation condition of the semiconductor chip 113 may include temperature of an adapter board (e.g., 111), humidity of the adapter board, pressure applied to the adapter board, tilt of the adapter board with respect to the motherboard 100, vibration, and a degree of bending of the adapter board. The sensed data may be transmitted in real time through the wireless transceiver mounted on the first adapter board 111 to, for example, an external server or device.

In the test apparatus according to an exemplary embodiment of the present inventive concept, a semiconductor chip 131 may be mounted on an upper surface of an adapter board, and various devices 200, such as a wireless transceiver 212, etc., may be mounted on a lower surface of the adapter hoard. However, exemplary embodiments of the present inventive concept are not limited thereto. Therefore, data about the adapter board may be sensed while the semiconductor chip 131 is being tested. In addition, data about the adapter board placed in the closed space 300 by the handler 120 may be sensed while the semiconductor chip 131 is being tested. The sensed data may be transmitted in real time during the testing of the semiconductor chip. The test apparatus according to an exemplary embodiment of the present inventive concept may determine whether an adapter board unit 110 is defective and the state (e.g., any abnormality in temperature or humidity) of the surrounding environment of the adapter board unit 110 based on the sensed data received in real time while the semiconductor chip 131 is being tested. Therefore, the productivity and reliability of the test apparatus may be improved.

A test apparatus according to an exemplary embodiment of the present inventive concept will now be described with reference to FIGS. 1 and 9. For clarity, a redundant description of elements and features that may be assumed to be substantially similar to elements and features described above will be omitted.

Figure 9:
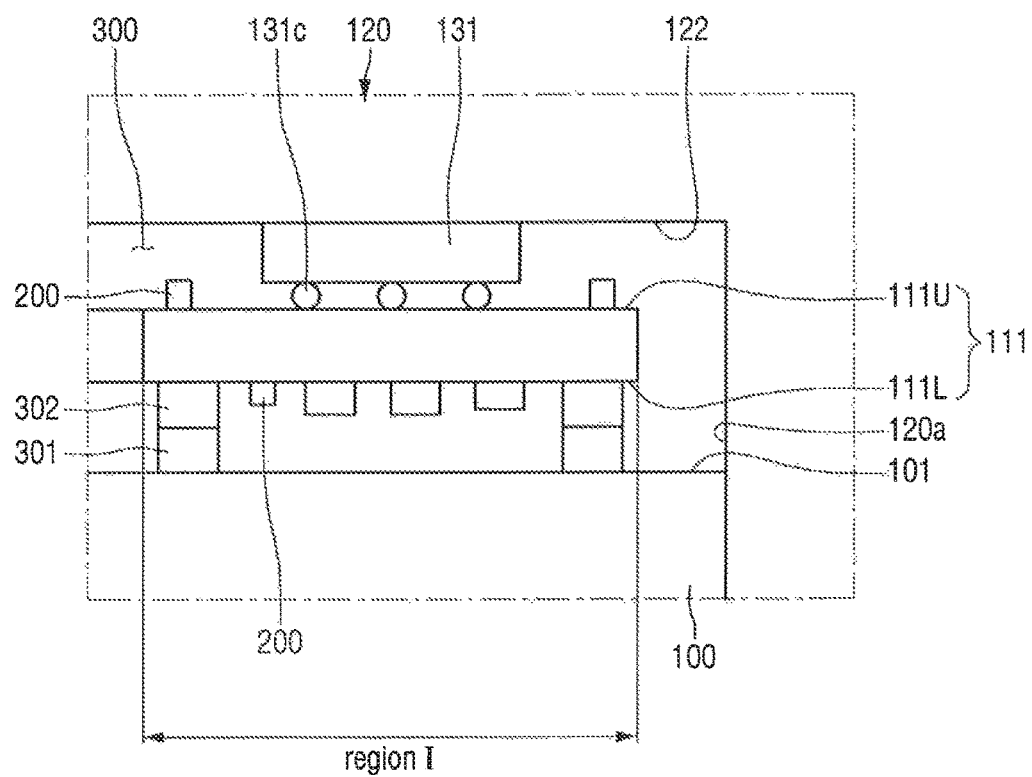

FIG. 9 is a side view of a first adapter board 111 according to an exemplary embodiment of the present inventive concept in a state in which a handler 120 may be mounted on a motherboard 100.

Referring to FIGS. 1 and 9, a semiconductor chip 131 and various devices 200 including sensors (e.g., 201 through 207) may be mounted on the first adapter board 111 according to exemplary embodiments of the present inventive concept. The semiconductor chip 131 may be mounted on the first adapter board 111 by the handler 120.

The various devices 200 including the sensors (e.g., 201 through 207) may be mounted on at least one of an upper surface 111U and a lower surface 111L of the first adapter board 111. In an exemplary embodiment of the present inventive concept, the various devices 200 including the sensors (e.g., 201 through 207) may be mounted on the upper surface 111U and the lower surface 111L of the first adapter board 111.

Sensors (e.g., 201 through 207) mounted on the upper surface 111U of the first adapter board 111 may not overlap the semiconductor chip 131. For example, sensors (e.g., 201 through 207) mounted on the upper surface 111U of the first adapter board 111 may be adjacent to and separated from the semiconductor chip 131. The sensors mounted on the upper surface 111U of the first adapter board 111 may be, e.g., a minimum number of sensors to measure the state of the first adapter board 111.

A test apparatus according to an exemplary embodiment of the present inventive concept will now be described with reference to FIGS. 1, 2, 7 and 10. For clarity, a redundant description of elements and features that may be assumed to be substantially similar to elements and features described above will be omitted.

Figure 10:
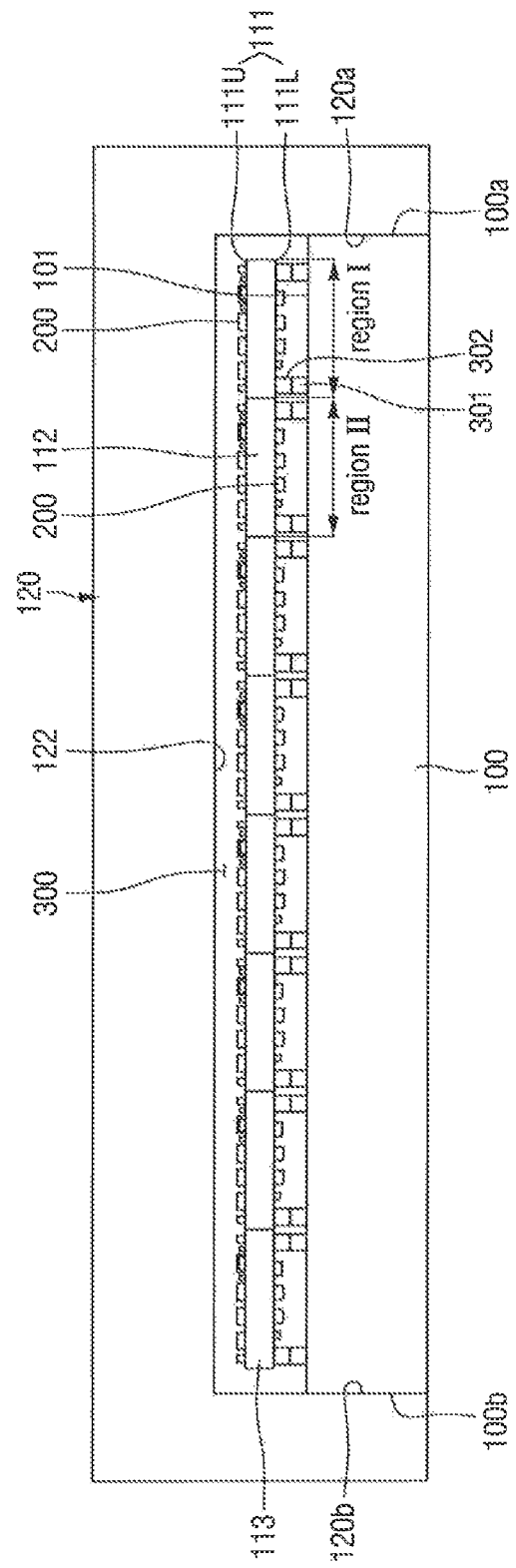
FIGS. 10, 11, 12 and 13 are side views of adapter board units according to an exemplary embodiment of the present inventive concept in a state in which a handler is mounted on a motherboard.

FIG. 10 is a side view of an adapter board unit 110 according to exemplary embodiments of the present inventive concept in a state in which a handler 120 may be mounted on a motherboard 100.

Referring to FIGS. 1, 2, 7 and 10, various devices 200 including sensors (e.g., 201 through 207) may be mounted on each adapter board of a plurality of adapter boards included in the adapter board unit 110 according to an exemplary embodiment of the present inventive concept.

The adapter board unit 110 may include first through fifth adapter boards 111 through 115. A first surface 101 of the motherboard 100 may include a first region region I and a second region region II. The first region region I and the second region region II may be adjacent to each other and separated from each other. The first through fifth adapter boards 111 through 115 may horizontally arranged on the first surface 101 of the motherboard 100. Further, the first through fifth adapter boards 111 through 115 might not be vertically stacked on the first surface 101 of the motherboard 100.

The first adapter board 111 may be disposed in the first region region I of the motherboard 100. The second adapter board 112 may be disposed in the second region region II of the motherboard 100.

The adapter board unit 110 may be disposed in a closed space 300 formed between the handler 120 and the motherboard 100.

The various devices 200 including the sensors (e.g., 201 through 207) may be mounted on each of the first through fifth adapter boards 111 through 115. For example, a temperature sensor 201 may be mounted on at least one of an upper surface and a lower surface of each of the first through fifth adapter hoards 111 through 115. Further, the temperature sensor 201 may be mounted on at least one of the first through fifth adapter boards 111 through 115, or the temperature sensor 201 might not be mounted on any of the first through fifth adapter boards 111 through 115. For example, a wireless transceiver 212 may be mounted on one of the upper surface and the lower surface of each of the first through fifth adapter boards 111 through 115. Further, the wireless transceiver 212 may be mounted on at least one of the first through fifth adapter boards 111 through 115, or the wireless transceiver 212 might not be mounted on any of the first through fifth adapter boards 111 through 115.

Sensors (e.g., 201 through 207) mounted on the first through fifth adapter boards 111 through 115 may sense various data about the adapter board unit 110. The various data may include data about the temperature, humidity, bending, vibration, etc. of the first through fifth adapter boards 111 through 115. The sensed data may be transmitted in real time by the wireless transceiver 212 mounted on each of the first through fifth adapter boards 111 through 115.

While a tray 130 is not illustrated in FIG. 10, FIG. 10 is merely an example, and exemplary embodiments of the present inventive concept are not limited to this example. For example, the tray 130 may be mounted on a fourth surface 122 of the handler 120. The tray 130 might not contact the various devices 200 including the sensors (e.g., 201 through 207) mounted on the adapter board unit 110.

In an exemplary embodiment of the present inventive concept, the tray 130 might not include semiconductor chips 131. For example, semiconductor chips 131 might not be mounted on the adapter boards of the adapter board unit 110 by the handler 120.

Further, the test apparatus according to an exemplary embodiment of the present inventive concept may be used to diagnose the state of the adapter board unit 110, disposed in the closed space 300, by receiving various data about the adapter board unit 110 in real time.

A test apparatus according to an exemplary embodiment of the present inventive concept will now be described with reference to FIGS. 1, 2, 7 and 11. For clarity, a redundant description of elements and features that may be assumed to be substantially similar to elements and features described above will be omitted.

Figure 11:
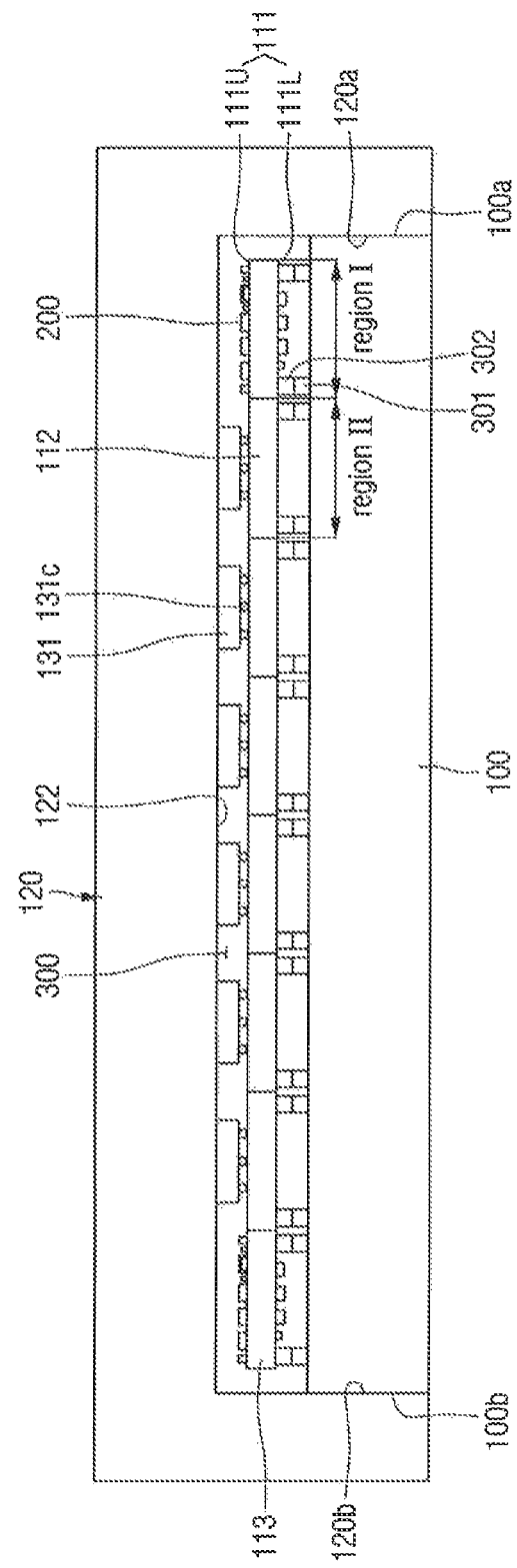

FIG. 11 is a side view of an adapter board unit 110 according to exemplary embodiments of the present inventive concept in a state in which a handler 120 may be mounted on a motherboard 100.

Referring to FIGS. 1, 2, 7 and 11, various devices 200 including sensors (e.g., 201 through 207) may be mounted on at least one of the first and third adapter boards 111 and 113, and a semiconductor chip 131 may be mounted on a second adapter board 112. However, in exemplary embodiments of the present inventive concept, the semiconductor chip 131 may be mounted on a plurality of adapter boards of the adapter board unit 110.

In an exemplary embodiment of the present inventive concept, the various devices 200 including the sensors (e.g., 201 through 207) may be mounted on the first adapter board 111, the third adapter board 113, a fourth adapter board 114 and a fifth adapter board 115. For example, semiconductor chips 131 might not be mounted on the first adapter board 111, the third adapter board 113, the fourth adapter board 114 and the fifth adapter board 115. However, exemplary embodiments of the present inventive concept are not limited thereto. The various devices 200 including the sensors (e.g., 201 through 207) may be mounted on at least one adapter board of a plurality of adapter boards of the adapter board unit 110.

In an exemplary embodiment of the present inventive concept, the first adapter board 111, the third adapter board 113, the fourth adapter board 114 and the fifth adapter board 115 may all have substantially the same configuration of various devices 200. For example, the third adapter board 113, the fourth adapter board 114 and the fifth adapter board 115 may have a configuration substantially the same as that of the first adapter board 111. However, the present inventive concept is not limited thereto. For example, various types and numbers of sensors (e.g., 201 through 207) and various devices 200 may be mounted on the first adapter board 111, the third adapter board 113, the fourth adapter board 114 and the fifth adapter board 115.

Semiconductor chips 131 may be mounted on adapter boards of the adapter board unit 110, excluding the adapter boards 111, 113, 114 and 115 on which the various devices 200 including the sensors (e.g., 201 through 207) may be mounted. The various devices 200 including the sensors might not be mounted on the adapter boards on which the semiconductor chips 131 are mounted.

While a tray 130 is not illustrated in FIG. 11, FIG. 11 is merely an example, and exemplary embodiments of the present inventive concept is not limited to this example. For example, the tray 130 may be placed between the adapter board unit 110 and a fourth surface 122 of the handler 120. For example, the tray 130 may be mounted on the fourth surface 122 of the handler 120. For example, the tray 130 may include the semiconductor chips 131. The semiconductor chips 131 may be mounted on the adapter boards of the adapter board unit 110 by the handler 120, excluding the adapter boards 111, 113, 114 and 115 on which the various devices 200 including the sensors (e.g., 201 through 207) may be mounted.

In the test apparatus according to an exemplary embodiment of the present inventive concept, the various devices 200 including the sensors (e.g., 201 through 207) can sense data about the adapter board unit 110 and a closed space 300 during a test of whether the semiconductor chips 131 operate without a defect. The sensed data can be transmitted in real time by a wireless transceiver 212 mounted on each of the first adapter board 111, the third adapter board 113, the fourth adapter board 114 and the fifth adapter board 115.

Therefore, the test apparatus according to an exemplary embodiment of the present inventive concept may obtain various data about the adapter board unit 110 in real time even while testing whether the semiconductor chips 131 operate normally. Since the test apparatus may determine whether the adapter board unit 110 is defective and the state (e.g., any abnormality in temperature or humidity) of the surrounding environment of the adapter board unit 110 based on the sensed data, the productivity and reliability of the test apparatus may be improved.

A test apparatus according to exemplary embodiments of the present inventive concept will now be described with reference to FIGS. 1, 2, 8 and 12. For clarity, a redundant description of elements and features that may be assumed to be substantially similar to elements and features described above will be omitted.

Figure 12:
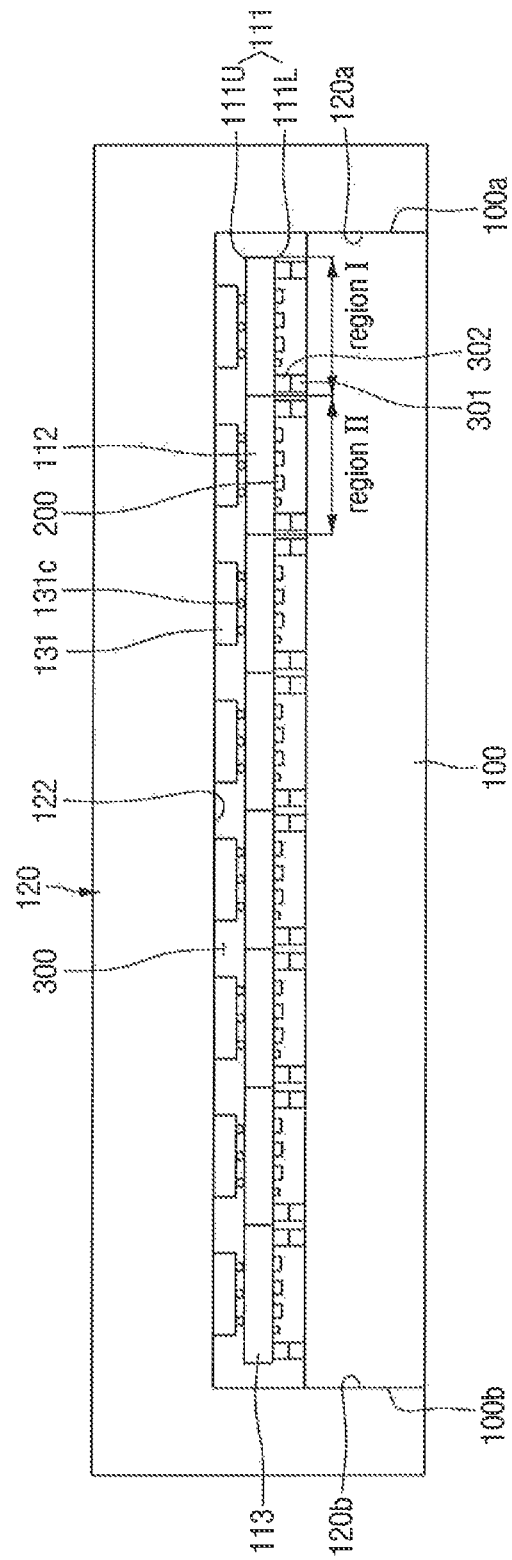

FIG. 12 is a side view of an adapter board unit 110 according to exemplary embodiments of the present inventive concept in a state in which a handler 120 may be mounted on a motherboard 100.

Referring to FIGS. 1, 2, 8 and 12, a semiconductor chip 131 and various devices 200 including sensors (e.g., 201 through 207) may be mounted on a plurality of adapter boards according to exemplary embodiments of the present inventive concept.

In an exemplary embodiment of the present inventive concept, the semiconductor chip 131 and the various devices 200 including the sensors (e.g., 201 through 207) may be mounted on each adapter board of the plurality of adapter boards included in the adapter board unit 110. For example, the semiconductor chip 131 may be mounted on an upper surface of each of the adapter boards, and the various devices 200 including the sensors (e.g., 201 through 207) may be mounted on a lower surface of each of the adapter boards.

While a predetermined number of sensors may be mounted on the lower surface of each adapter board of the adapter boards in FIG. 12, this is merely an example used for ease of description, and exemplary embodiments of the present inventive concept are not limited to this example. For example, the various devices 200 including various numbers and types of sensors (e.g., 201 through 207) may be mounted on each of the adapter boards of the adapter board unit 110.

In an exemplary embodiment of the present inventive concept, each of the adapter boards of the adapter board unit 110 may have substantially the same configuration of various devices 200 as that of the first adapter board 111 of FIG. 8.

In the adapter board unit 110 of the test apparatus according to an exemplary embodiment of the present inventive concept, the various devices 200 including the sensors (e.g., 201 through 207) may be mounted on the lower surface of each of the adapter boards to collect various data about the adapter board unit 110 during a test of whether the semiconductor chip 131 operates normally. Here, a minimum number of sensors to obtain data about, e.g., the surrounding environment of the adapter board unit 110. Further, the sensors (e.g., 201 through 207) may be mounted on the lower surface of each of the adapter boards.

Therefore, even if the adapter board unit 110 is disposed in a closed space 300, data about the adapter board unit 110 may be obtained. In addition, sensed data may be transmitted in real time during a test of the semiconductor chip 131. Since the test apparatus may determine whether the adapter board unit 110 is defective and the state (e.g., any abnormality in temperature or humidity) of the surrounding environment based on the sensed data, the productivity and reliability of the test apparatus may be improved.

A test apparatus according to exemplary embodiments of the present inventive will now be described with reference to FIGS. 1, 2, 9 and 13. For clarity, a redundant description of elements and features that may be assumed to be substantially similar to elements and features described above will be omitted.

Figure 13:
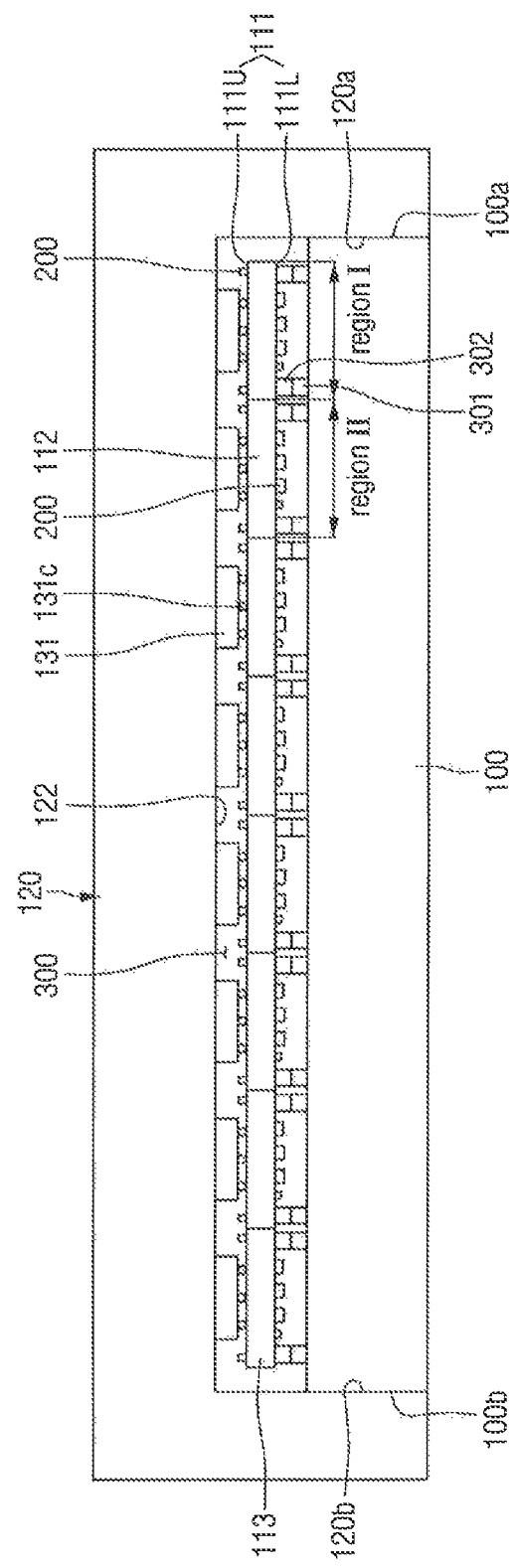

FIG. 13 is a side view of an adapter board unit 110 according to exemplary embodiments of the present inventive concept in a state in which a handler 120 may be mounted on a motherboard 100.

Referring to FIGS. 1, 2, 9 and 13, a semiconductor chip 131 and various devices 200 including sensors (e.g., 201 through 207) may be mounted on a first adapter board 111 according to exemplary embodiments of the present inventive concept.

In an exemplary embodiment of the present inventive concept, the semiconductor chip 131 and the various devices 200 including the sensors (e.g., 201 through 207) may be mounted on each adapter board of a plurality of adapter boards included in the adapter board unit 110. For example, the semiconductor chip 131 and the various devices 200 including the sensors (e.g., 201 through 207) may be mounted on an upper surface of each of the adapter boards, and the various devices 200 including the sensors (e.g., 201 through 207) may be mounted on a lower surface of each of the adapter boards.

While a predetermined number of sensors (e.g., 201 through 207) may be mounted on the upper surface and the lower surface of each of the adapter boards in FIG. 13, this is merely an example, and exemplary embodiments of the present inventive concept are not limited to this example. For example, the various devices 200 including various numbers and types of sensors may be mounted on each of the adapter boards of the adapter board unit 110.

In an exemplary embodiment of the present inventive concept, each of the adapter boards of the adapter board unit 110 may have substantially the same configuration as the first adapter board 111 of FIG. 9.

A minimum number of sensors (e.g., 201 through 207) needed to obtain data about, e.g., the surrounding environment of the adapter hoard unit 110 and the adapter board unit 110 itself, may be mounted on the upper surface and the lower surface of each of the adapter boards. The various devices 200 including the sensors (e.g., 201 through 207) mounted on the upper surface of each of the adapter boards may be positioned adjacent to and separated from the semiconductor chip 131.

While the present inventive concept has been shown and described with reference to the exemplary embodiments thereof, it will be apparent to those of ordinary skill in the art that various changes in form and detail may be made thereto without departing from the spirit and scope of the present inventive concept.

What is claimed is:

1. A test apparatus comprising:
   a motherboard including a first surface;
   a handler including a second surface facing the first surface of the motherboard;
   an adapter board disposed between the first surface of the motherboard and the second surface of the handler;
   a first sensor mounted on the adapter board and senses data about temperature of the adapter board;
   a wireless transceiver mounted on the adapter board and transmits, in real time, the sensed data;
   a second sensor mounted on the adapter board, wherein the second sensor is different from the first sensor;
   a microcontroller mounted on at least one of an upper surface or a lower surface of the adapter board, and controls the first sensor;
   a nonvolatile memory mounted on at least one of the upper surface or the lower surface of the adapter board, and stores the data;
   a battery mounted on at least one of the upper surface or the lower surface of the adapter board, and supplies power; and
   an antenna pattern provided on at least one of the upper surface or the lower surface of the adapter board, and receives power,
   wherein the handler comprises an opening including the second surface, wherein the motherboard is disposed in the opening of the handler and occupies a portion of the opening to form a remaining part of the opening as a closed space, and the adapter board is disposed in the closed space,
   wherein the second sensor senses an environmental condition of the closed space.

2. The test apparatus of claim 1, wherein the second sensor senses humidity, wherein the wireless transceiver transmits, in real time, data sensed by the second sensor.

3. The test apparatus of claim 1, further comprising a semiconductor chip mounted on an upper surface of the adapter board.

4. The test apparatus of claim 3, wherein the sensed data is data measured during a test and compared against preset data to determine operation condition of the semiconductor chip.

5. The test apparatus of claim 1, wherein the first sensor is mounted on at least one of an upper surface of the adapter board or a lower surface of the adapter board.

6. A test apparatus comprising:

a motherboard including a first surface;

a handler including a second surface facing the first surface of the motherboard;

an adapter board unit disposed on the first surface of the motherboard, wherein the adapter board unit includes a first adapter board, a second adapter board and a third adapter board disposed between the first and second adaptor boards;

a plurality of first sensors mounted on the first adapter board and the second adapter board, wherein a first sensor of the plurality of first sensors senses a first operation condition of the adapter board;

a plurality of second sensors mounted on a lower surface of the first and second adapter boards;

a third sensor mounted on the first adapter board, the second adapter board or the third adapter board, wherein the third sensor is different from the first sensor, and senses a second operation condition of the adapter board different from that of the first sensor; and a first semiconductor chip mounted on an upper surface of one of the first, second or third adapter board, wherein the plurality of first sensors is mounted on the upper surface of the first, second and third adapter boards, wherein the plurality of first sensors and the plurality of second sensors each comprise one of a temperature sensor that measures temperature of the first and second adapter boards, a tilt sensor that measures a tilt of the first and second adapter boards with respect to the motherboard, a vibration sensor that measures whether the first and second adapter boards vibrate, a bending sensor that measures a degree of bending of the first and second adapter boards, or a humidity sensor that measures humidity of the first and second adapter boards, and the plurality of first sensors comprise a sensor different from that of the plurality of second Sensors.

7. The test apparatus of claim 6, wherein the handler comprises an opening including the second surface, wherein the motherboard is disposed in the opening of the handler and occupies a portion of the opening to form a remaining part of the opening as a closed space, and the adapter board with the plurality of first sensors is disposed in the closed space.

* * * * *